(12) United States Patent
Akyildiz

(10) Patent No.: US 7,813,410 B1
(45) Date of Patent: Oct. 12, 2010

(54) INITIATING SPREAD SPECTRUM MODULATION

(75) Inventor: Ahmet Akyildiz, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 973 days.

(21) Appl. No.: 11/489,795

(22) Filed: Jul. 19, 2006

Related U.S. Application Data

(60) Provisional application No. 60/713,956, filed on Sep. 2, 2005.

(51) Int. Cl.
*H04B 1/69* (2006.01)

(52) U.S. Cl. ..................................... 375/130

(58) Field of Classification Search ................ 375/130, 375/139, 354, 376; 327/142, 147, 156
See application file for complete search history.

(56) References Cited

U.S. PATENT DOCUMENTS

| | | | |
|---|---|---|---|
| 2,671,896 A | 3/1954 | DeRosa | |
| 2,953,780 A | 4/1959 | Goldfischer | |
| 3,878,527 A | 4/1975 | Rensin et al. | |
| 4,578,649 A | 3/1986 | Shupe | |
| 4,857,866 A | 8/1989 | Tateishi | |
| 5,036,216 A | 7/1991 | Hohmann et al. | |
| 5,142,247 A * | 8/1992 | Lada et al. | 331/14 |
| 5,148,447 A | 9/1992 | Ito | |
| 5,204,877 A | 4/1993 | Endo et al. | |
| 5,226,058 A | 7/1993 | Anderson et al. | |
| 5,416,434 A | 5/1995 | Hardin et al. | |
| 5,483,558 A | 1/1996 | Leon et al. | |
| 5,488,627 A | 1/1996 | Hardin et al. | |
| 5,491,458 A | 2/1996 | McCune, Jr. et al. | |
| 5,587,715 A * | 12/1996 | Lewis | 342/357.03 |
| 5,610,955 A | 3/1997 | Bland | |
| 5,631,920 A | 5/1997 | Hardin | |
| 5,861,766 A | 1/1999 | Baumer et al. | |
| 5,872,807 A | 2/1999 | Booth et al. | |
| 6,292,507 B1 | 9/2001 | Hardin et al. | |
| 6,377,646 B1 | 4/2002 | Sha | |

(Continued)

FOREIGN PATENT DOCUMENTS

EP 0655829 A1 5/1995

(Continued)

OTHER PUBLICATIONS

Cypress Preliminary Publication CY28412 "Clock Generator for Intel[R] Grantsdale Chipset", revised Dec. 21, 2004 Document 38-07612 Rev. C, 17 pages Cypress Semiconductor Corporation 3901 North First Street, San Jose CA 95134.

(Continued)

*Primary Examiner*—Young T. Tse

(57) ABSTRACT

An apparatus and a method to initiate spread spectrum modulation have been presented. In one embodiment, a spread spectrum off to spread spectrum on transition circuit is used to start spread spectrum modulation. The spread spectrum off to spread spectrum on transition circuit may include a phase lock loop (PLL) to output a clock signal. The spread spectrum off to spread spectrum on transition circuit may further include a control block coupled to the PLL to cause the PLL to lock the clock signal to a predetermined center frequency before transitioning from a non-spread spectrum mode into a spread spectrum mode.

19 Claims, 9 Drawing Sheets

U.S. PATENT DOCUMENTS

| | | | |
|---|---|---|---|
| 6,553,057 B1 | 4/2003 | Sha et al. | |
| 6,580,432 B1* | 6/2003 | Leung et al. | 345/558 |
| 6,590,949 B1 | 7/2003 | Marten et al. | |
| 6,850,554 B1* | 2/2005 | Sha et al. | 375/140 |
| 2003/0174126 A1* | 9/2003 | Wang | 345/204 |

FOREIGN PATENT DOCUMENTS

EP             0739089 A1    10/1996

OTHER PUBLICATIONS

Cypress Publication CY28410 "Clock Generator for Intel$^R$ Grantsdale Chipset", revised Sep. 28, 2004, Document No. 38-07593 Rev. C, 18 pages Cypress Semiconductor Corporation 3901 North First Street, San Jose CA 95134.

USPTO Notice of Allowance for U.S. Appl. No. 09/436,522 dated Oct. 4, 2004; 8 pages.

USPTO Non-Final Rejection for U.S. Appl. No. 09/436,522 dated Mar. 15, 2004; 10 pages.

USPTO Final Rejection for U.S. Appl. No. 09/436,522 dated Jul. 30, 2003; 5 pages.

USPTO Non-Final Rejection for U.S. Appl. No. 09/436,522 dated Oct. 3, 2002; 13 pages.

USPTO Non-Final Rejection for U.S. Appl. No. 09/436,522 dated Oct. 6, 2003; 9 pages.

Young et al., "A PLL Clock Generator with 5 to 10 MHz of Lock Range for Microprocessors," IEEE Journal of Solid-State Circuits, vol. 27, Issue 11, Nov. 1992, pp. 1599-1607; 10 pages.

Hardin et al., "Design Considerations of Phase-Locked Loop Systems for Spread Spectrum Clock Generation Compatibility," Electromagnetic Compatibility, Aug. 1997, IEEE 1997 International Symposium, pp. 302-307; 6 pages.

USPTO Notice of Allowance for U.S. Appl. No. 08/336,006 dated Aug. 25, 1995; 4 pages.

USPTO Non-Final Rejection for U.S. Appl. No. 08/336,006 dated May 3, 1995; 3 pages.

USPTO Notice of Allowance for U.S. Appl. No. 09/120,536 dated Aug. 22, 2001; 1 page.

USPTO Non-Final Rejection for U.S. Appl. No. 09/120,536 dated May 4, 2001; 5 pages.

USPTO Restriction for Requirement/Election for U.S. Appl. No. 09/120,536 dated Mar. 12, 2001; 3 pages.

"Spread Spectrum Clock Generator," W42C31/32, IC Works, Revision 0.1, Mar. 1997, Appendix A-C; 20 pages.

USPTO Notice of Allowance for U.S. Appl. No. 09/436,155 dated Dec. 16, 2002; 6 pages.

USPTO Non-Final Rejection for U.S. Appl. No. 09/436,155 dated Oct. 11, 2002; 5 pages.

* cited by examiner

INITIATING SPREAD SPECTRUM MODULATION

REFERENCE TO RELATED APPLICATION

This application claims the benefit of U.S. Provisional Patent Application No. 60/713,956, filed on Sep. 2, 2005.

TECHNICAL FIELD

The present invention relates generally to integrated circuits (ICs), and more particularly, to clock signal generation circuits.

BACKGROUND

As the processing power and utility of personal computers (PCs) has increased over the years, they have become ubiquitous in business, industry, and the home. With the increase in performance and operating frequency, motherboards in PC systems have become more sensitive to frequency drifts in clock signals.

Many conventional clock generators and frequency timing generation (FTG) products use spread spectrum modulation to reduce electromagnetic interference (EMI) generated. Basically, the output frequency is modulated with a predetermined amplitude (such as 0.5%), a predetermined rate (such as 33 kHz), and a predetermined center frequency (such as −0.25%). One example of a spread spectrum modulation waveform is shown in FIG. 1.

In many conventional systems, spread spectrum modulation is off (i.e., operating in non-spread spectrum mode) at power-up. A user can turn on the spread spectrum modulation via an input pin and/or through an interface, such as the widely used Inter-Integrated Circuit (I2C) interface. When the spread spectrum modulation is turned on, the system is operating in a spread spectrum mode. During the transition from the non-spread spectrum mode to the spread spectrum mode, the phase lock loop (PLL) that generates the clock signal starts trying to lock to the new center frequency and overshoot and/or undershoot may occur. However, excessive frequency overshoot/undershoot may cause failure on the system.

In a conventional PLL, the center PLL frequency (Fpll) is determined by a reference frequency (Fref), a feedback divider value (N), and a reference divider value (M), where (Fpll=N*Fref/M). Different M, N numbers are used for spread spectrum mode and non-spread spectrum mode (M1, N1 and M2, N2, respectively) since the center frequencies in these two modes are generally different.

In many conventional systems, there is no specific technique used to make the transition smoothly. When spread spectrum modulation is off, the PLL is locked to a certain frequency, with certain reference (M1) and feedback (N1) divider values. When a spread spectrum request comes, new reference (M2) and feedback (N2) values are loaded. At about the same time, spread spectrum modulation starts. When the PLL tries to lock to a new center frequency on the top of spread spectrum modulation, it typically causes overshoot and/or undershoot.

FIG. 2 shows a block diagram of one conventional spread spectrum off to spread spectrum on transition circuit. The circuit 200 includes a phase lock loop (PLL) 210, a programmable reference divider 221, a programmable feedback divider 231, two multiplexers 223 and 233, and four registers 225, 227, 235, and 237. The four registers 225, 227, 235, and 237 hold constants associated with either a spread spectrum mode or a non-spread spectrum mode. For instance, register 225 holds a spread off load value (M1), register 227 holds a spread on load value (M2), register 235 holds a spread off load value (N1), and register 237 holds a spread off load value (N2). The programmable reference divider 221 and the programmable feedback divider 231 respectively output a reference signal and a feedback signal to the PLL 210. The PLL 210 generates an output clock signal 209 based on the reference signal and the feedback signal.

When the circuit 200 is in the non-spread spectrum mode, M1 and N1 are loaded into the programmable reference divider 221 and the programmable feedback divider 231, respectively. To start spread spectrum modulation, a spread request signal 201 may be sent to the circuit 200. In response to the spread request signal 201, the multiplexers 223 and 233 load M2 and N2 into the programmable reference divider 221 and the programmable feedback divider 231, respectively.

The direct transition from M1, N1 to M2, N2 while starting spread spectrum modulation at about the same time causes overshoot and/or undershoot as the PLL 210 is trying to settle to a new center frequency. FIG. 3 shows a waveform of a clock signal generated using a conventional spread spectrum off to spread spectrum on transition circuit. There are both overshoot 310 and undershoot 320 in the clock signal generated.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly couple and to indirectly couple through one or more intervening components.

In one embodiment, a spread spectrum off to spread spectrum on transition circuit is provided to initiate or to start spread spectrum modulation on a clock signal. The spread spectrum off to spread spectrum on transition circuit includes a phase lock loop (PLL) to output the clock signal. The spread spectrum off to spread spectrum on transition circuit further includes a control block coupled to the PLL to cause the PLL to lock the clock signal to a predetermined center frequency before transitioning from a non-spread spectrum mode into a spread spectrum mode. More details of some embodiments of the spread spectrum off to spread spectrum on transition circuit are described below.

Figure 1:
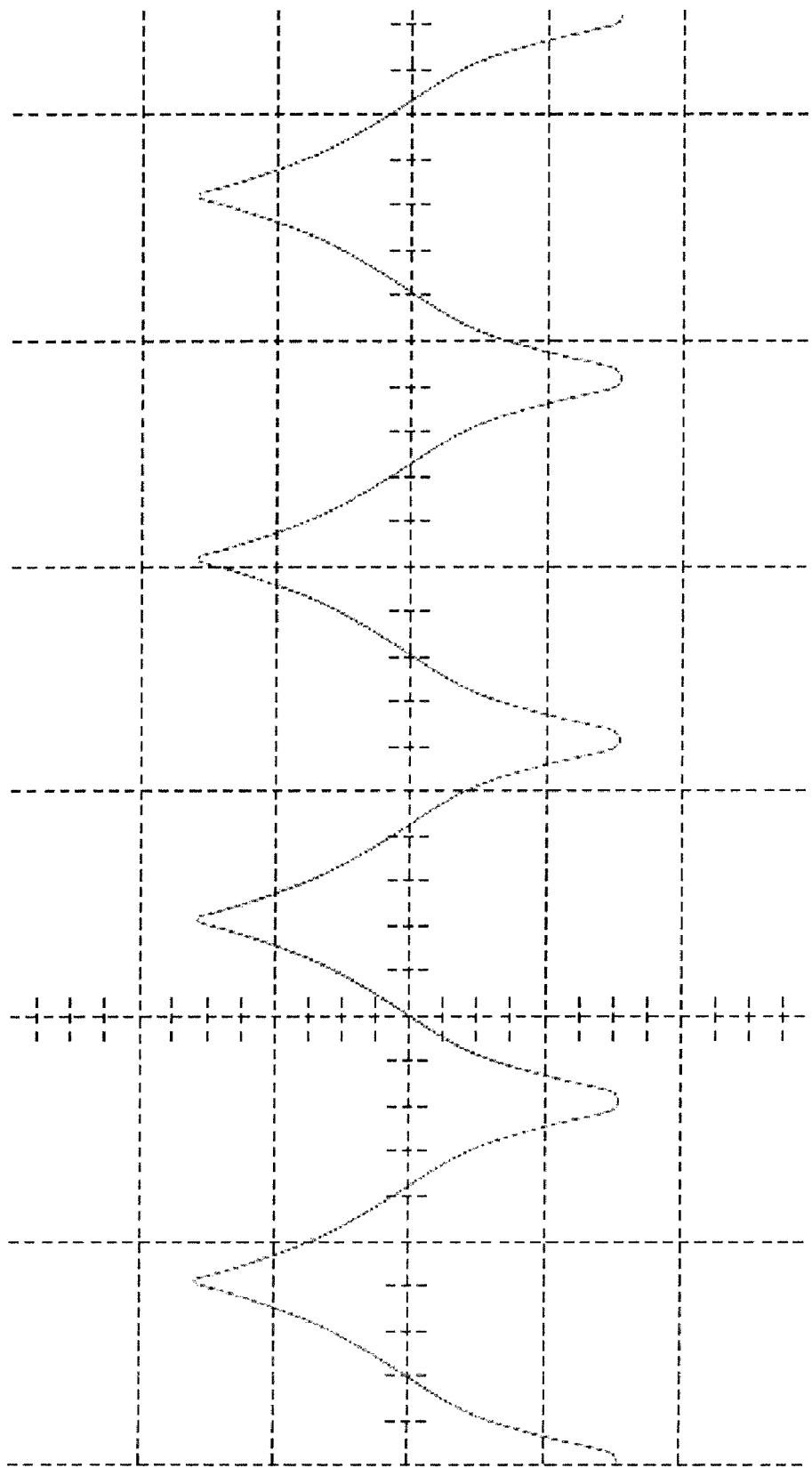
FIG. 1 shows an exemplary waveform of a clock signal having spread spectrum modulation.
Figure 2:
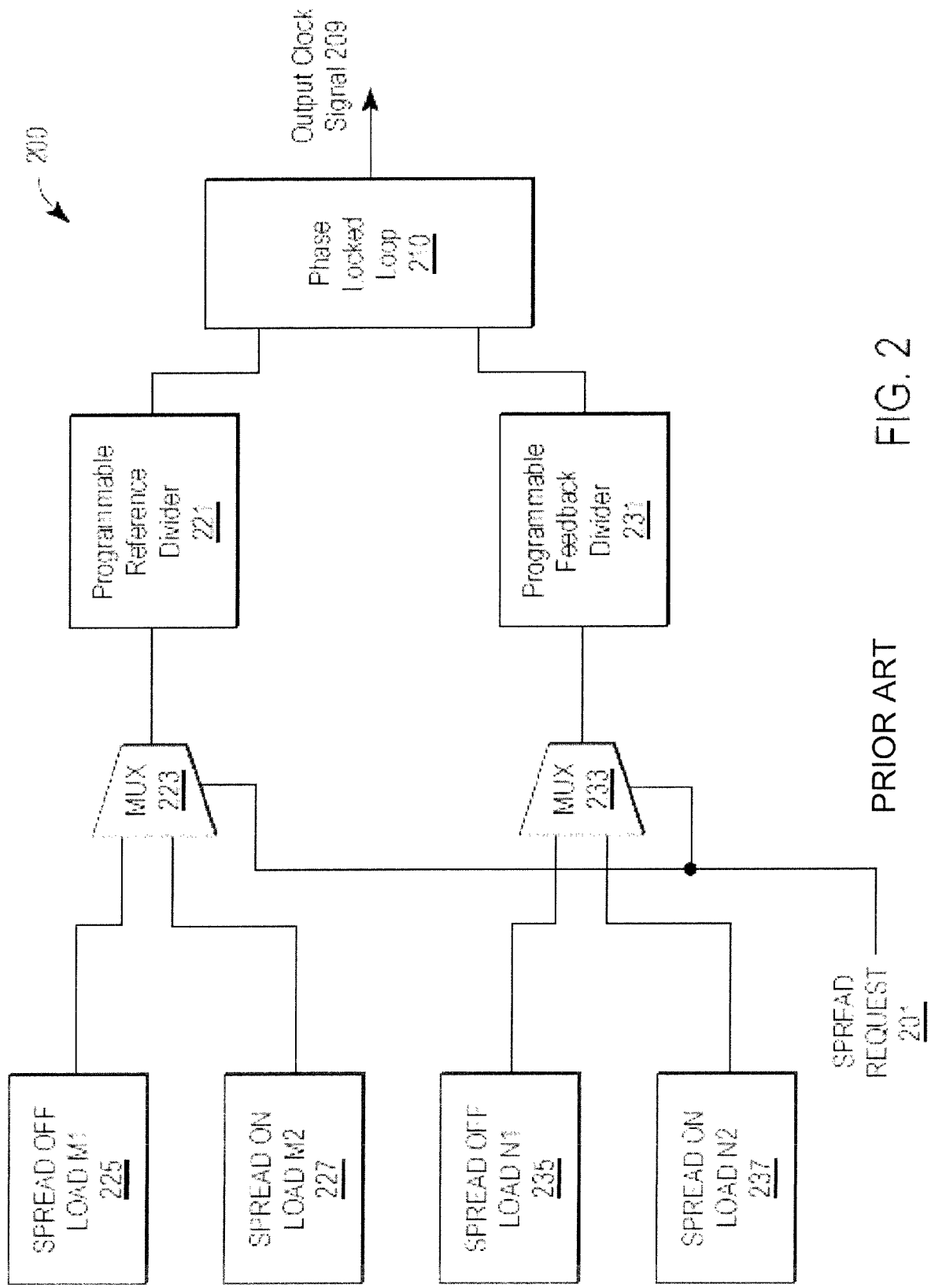
FIG. 2 shows a conventional spread spectrum off to spread spectrum on transition circuit.
Figure 3:
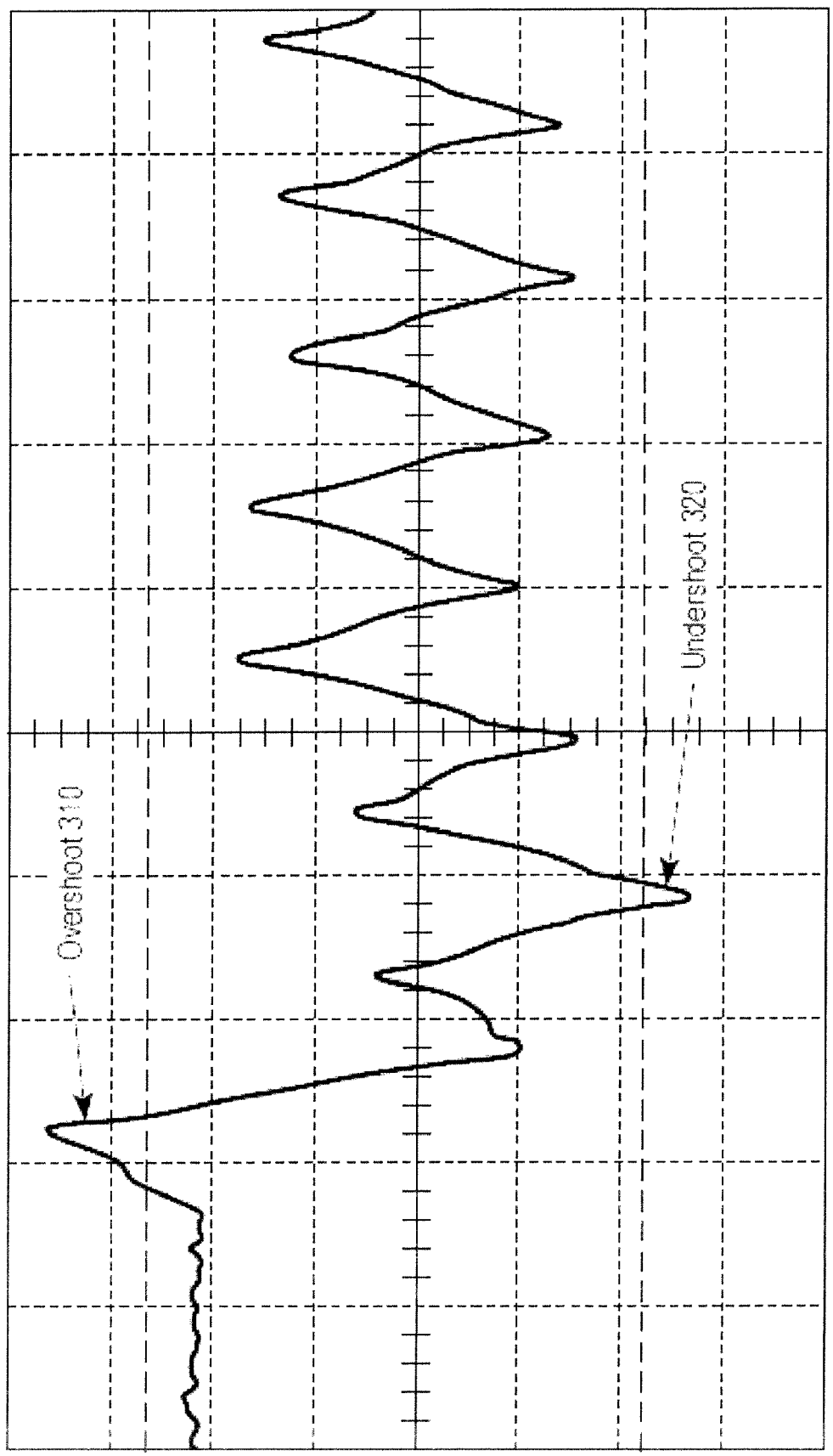
FIG. 3 shows a waveform of a clock signal generated using a conventional spread spectrum off to spread spectrum on transition circuit.
Figure 4:
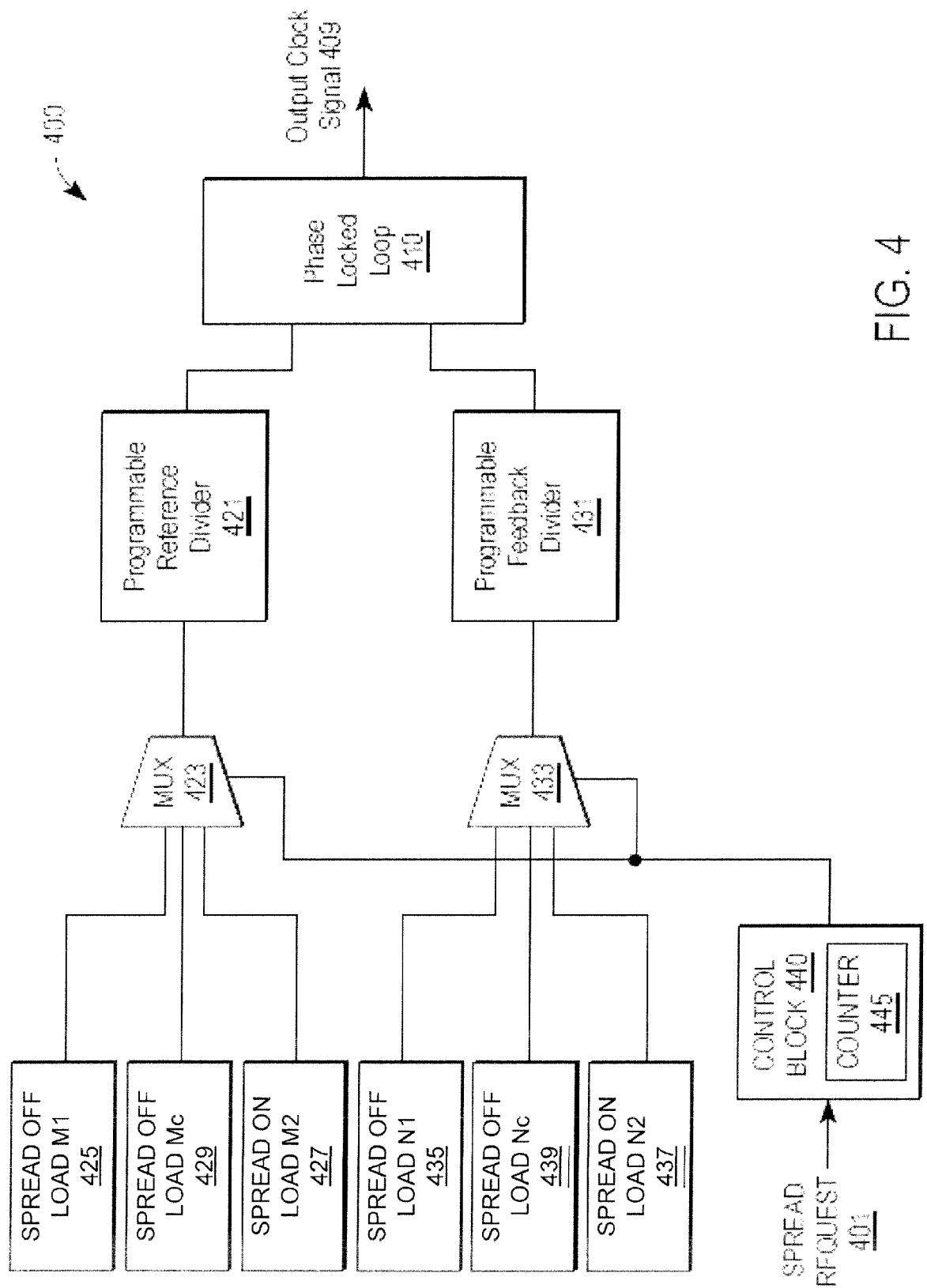
FIG. 4 shows one embodiment of a spread spectrum off to spread spectrum on transition circuit.

FIG. 4 shows one embodiment of a spread spectrum off to spread spectrum on transition circuit. The spread spectrum off to spread spectrum on transition circuit 400 includes a PLL 410, a programmable reference divider 421, a programmable feedback divider 431, a first multiplexer (MUX) 423, a second MUX 433, a number of storage devices 425, 427, 429, 435, 437, and 439, and a control block 440. The storage devices 425, 427, 429, 435, 437, and 439 may include registers. Alternatively, the storage devices 425, 427, 429, 435, 437, and 439 may include read-only memories (ROMs). In one embodiment, the storage devices 425, 427, 429, 435, 437, and 439 store a first spread off load value (M1), a first spread on load value (M2), a first center spread off load value (Mc), a second spread off load value (N1), a second spread on load value (N2), and a second center spread off load value (Nc), respectively.

In general, the PLL 410 is operable to generate an output clock signal 409. The control block 440 may turn on or off spread spectrum modulation on the output clock signal 409. When spread spectrum modulation is on, the circuit 400 is referred to be in a spread spectrum mode. When spread spectrum modulation is off, the circuit 400 is referred to be in a non-spread spectrum mode. The center frequency of the PLL 410 may be determined by a feedback divider value (N) and a reference divider value (M), where (Fpll=N*Fref/M). In one embodiment, M1 and N1 are the M and N values used for the non-spread spectrum mode and M2 and N2 are the M and N values used for the spread spectrum mode. In addition, Mc and Nc are the M and N values used during the transition from the non-spread spectrum mode to the spread spectrum mode. Alternatively, Mc may be derived from M1, in which case, the storage device 429 may be eliminated. For example, Mc may be set to be substantially equal to a difference between M1 and a constant, such as 1. Likewise, Nc may be derived from N1 and the storage device 439 may be eliminated.

In one embodiment, the control block 440 receives a spread request signal 401. The spread request signal 401 may be sent to the control block 440 in response to a user indicating a request to start spread spectrum modulation via an input pin and/or through an interface, such as an Inter-Integrated Circuit (I2C) interface. In response to the spread request signal 401, the control block 440 outputs a signal to cause the MUX 423 to select Mc from the storage device 429 and the MUX 433 to select Nc from the storage device 439. Then Mc and Nc are synchronously loaded to the programmable reference divider 421 and the programmable feedback divider 431, respectively. Using Mc and Nc, the programmable reference divider 421 and the programmable feedback divider 431 generate a signal having a reference frequency and a signal having a feedback frequency, respectively. Both signals are input to the PLL 410. Based on the reference frequency and the feedback frequency, the PLL 410 sets the center frequency of the output clock signal 409 at about (Fpllc=Nc*Fref/Mc).

In addition to synchronously loading Mc and Nc to the programmable reference divider 421 and the programmable feedback divider 431, the control block 440 counts until a predetermined value is reached. When the predetermined value is reached, the control block 440 causes the PLL 410 to start spread spectrum modulation on the output clock signal 409. In other words, the control block 440 causes the PLL 410 to wait for a period (as determined by the predetermined value) before entering into the spread spectrum mode. As such, the output clock signal 409 may substantially settle at about the predetermined center frequency before entering into the spread spectrum mode.

In some embodiments, a counter 445 in the control block 440 is reset in response to the spread request signal 401. Then the control block 440 loads Mc and Nc to the programmable reference divider 421 and the programmable feedback divider 431, respectively. While the counter 445 is counting, a waiting period is provided to the PLL 410 to lock to the new center frequency based on Mc and Nc. When the count of the counter 445 reaches a predetermined value, or in other words, the counter 445 times out, the control block 440 loads M2 and N2 to the programmable reference divider 421 and the programmable feedback divider 431 and to enter the spread spectrum mode.

The technique described above adds an intermediate operation into the process to start spread spectrum modulation on the output clock signal 409. As such, the circuit 400 does not attempt to lock to a new center frequency and to start spread spectrum modulation on the output clock signal 409 at about the same time. Hence, the overshoot and/or undershoot in the output clock signal 409 caused by an overlap of the locking of the new center frequency and the starting of spread spectrum modulation of the output clock signal 409 may be reduced.

Figure 5:
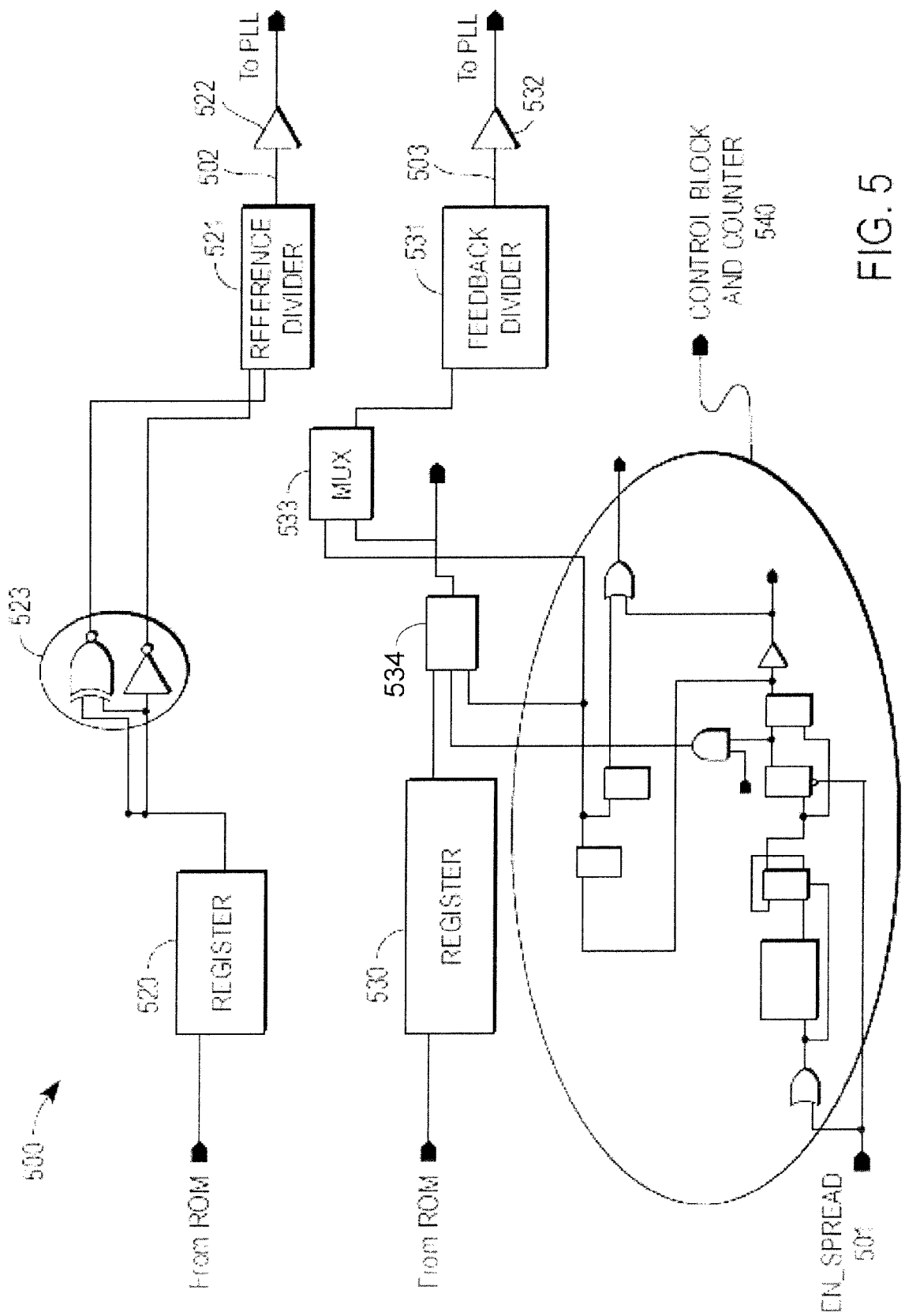
FIG. 5 shows a circuit diagram of one embodiment of a spread spectrum off to spread spectrum on transition circuit.

FIG. 5 shows a circuit diagram of one embodiment of a spread spectrum off to spread spectrum on transition circuit. The spread spectrum off to spread spectrum on transition circuit 500 includes a programmable reference divider 521, a programmable feedback divider 531, two buffers 522 and 532, a MUX 533, a signal selecting circuit 523, a first register 520, a second register 530, and a control block 540. The control block 540 receives a signal EN_SPREAD 501. In response to EN_SPREAD 501, the control block 540 performs operations to cause the circuit 500 to transition from a non-spread spectrum mode into a spread spectrum mode. More details of the control block 540 are discussed below with reference to FIG. 6.

In one embodiment, inputs of the registers 520 and 530 are coupled to read-only memory (ROM) devices that store some predetermined constants associated with a center frequency during transition, a center frequency of the non-spread spectrum mode, and a center frequency of the spread spectrum mode. Output of the registers 520 is coupled to the signal selecting circuit 523. In some embodiments, the signal selecting circuit 523 includes an exclusive-OR (XOR) gate and an inverter. Alternatively, the signal selecting circuit 523 may include a MUX. The output of the register 530 is coupled to the MUX 533 through signal selecting circuit 534. Outputs of the signal selecting circuit 523 and the MUX 533 are coupled to the programmable reference divider 521 and the programmable feedback divider 531, respectively. The outputs of the programmable reference divider 521 and the programmable feedback divider 531 are coupled to the buffers 522 and 532, respectively. The outputs of the buffers 522 and 532 are input to a PLL.

When the circuit 500 is in the non-spread spectrum mode, the constants associated with the center frequency of the non-spread spectrum mode, i.e., M1 and N1, are loaded to the programmable reference divider 521 and the programmable feedback divider 531, respectively. When a user requests to turn on spread spectrum modulation, EN_SPREAD 501 may be set. In some embodiments, a counter in the control block 540 is reset in response to EN_SPREAD 501. The constants associated with the center frequency during transition, namely Mc and Nc, are held in the registers 520 and 530. In some embodiments, Mc and Nc are derived from M1 and N1, respectively. Alternatively, Mc and Nc may be retrieved from the ROM devices. Then the control block 540 synchronously loads Mc and Nc to the programmable reference divider 521 and the programmable feedback divider 531, respectively, using the signal selecting circuit 523 and the MUX 533, respectively. Based on Mc and Nc, the programmable reference divider 521 and the programmable feedback divider 531 generate a first signal 502 having a reference frequency and a second signal 503 having a feedback frequency, respectively. Both signals 502 and 503 are input to a PLL via the buffers 522 and 532, respectively. In response to signals 502 and 503, the PLL may generate a clock signal having a center frequency based on Mc and Nc. While the counter is counting, a waiting period is provided to allow the PLL to lock to the center frequency based on Mc and Nc. When the counter times out, the control block 540 loads the constants associated with the spread spectrum mode, i.e., M2 and N2, to the programmable reference divider 521 and the programmable feedback divider 531 to enter the spread spectrum mode.

Figure 6:
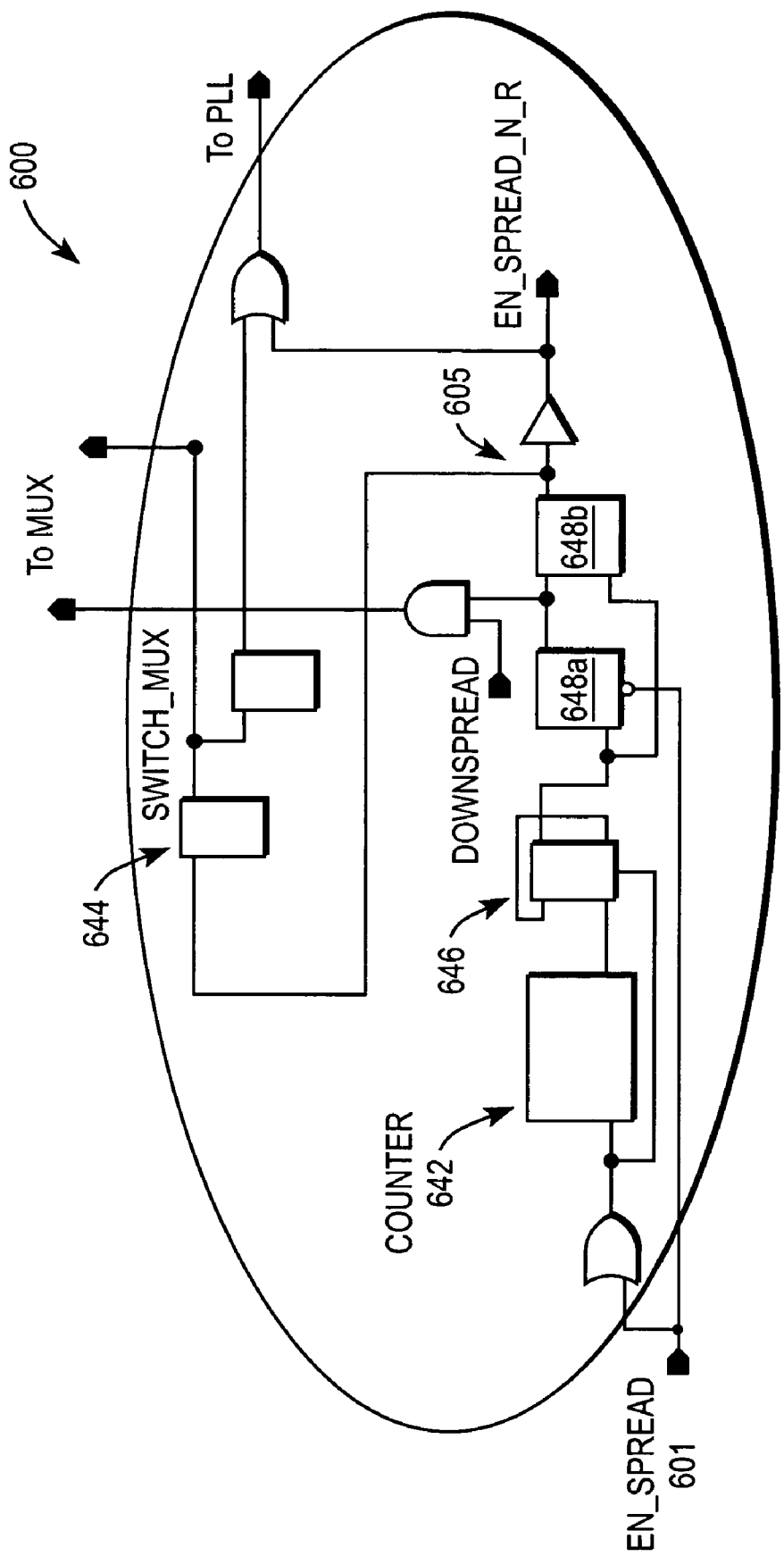
FIG. 6 shows one embodiment of a control block in a spread spectrum off to spread spectrum on transition circuit.

FIG. 6 shows one embodiment of a control block in a spread spectrum off to spread spectrum on transition circuit. The control block 600 includes a counter 642 and a number of switches 646, 648a, 648b, and 644. An input of the counter 642 receives a spread request signal, EN_SPREAD 601. In response to EN_SPREAD 601, the counter 642 is reset and then starts counting. An output of the counter 642, a.k.a. the count, may be input to a switch 646. The switch 646 may divide the count by two (2) in order to extend the waiting period before starting spread spectrum modulation. The output of the switch 646 may be further coupled to two additional switches 648a and 648b coupled in series. The switch 648b may output a signal 605 to start spread spectrum modulation. In some embodiments, the signal 605 is input to the switch 644. The output of the switch 644 may be sent to a signal selecting circuit (such as the MUX 533 or signal selecting circuit 534 in FIG. 5) to cause the constants associated with the center frequency (i.e., Mc and Nc) to be synchronously loaded into the programmable reference divider 521 and the feedback divider 531.

Figure 7:
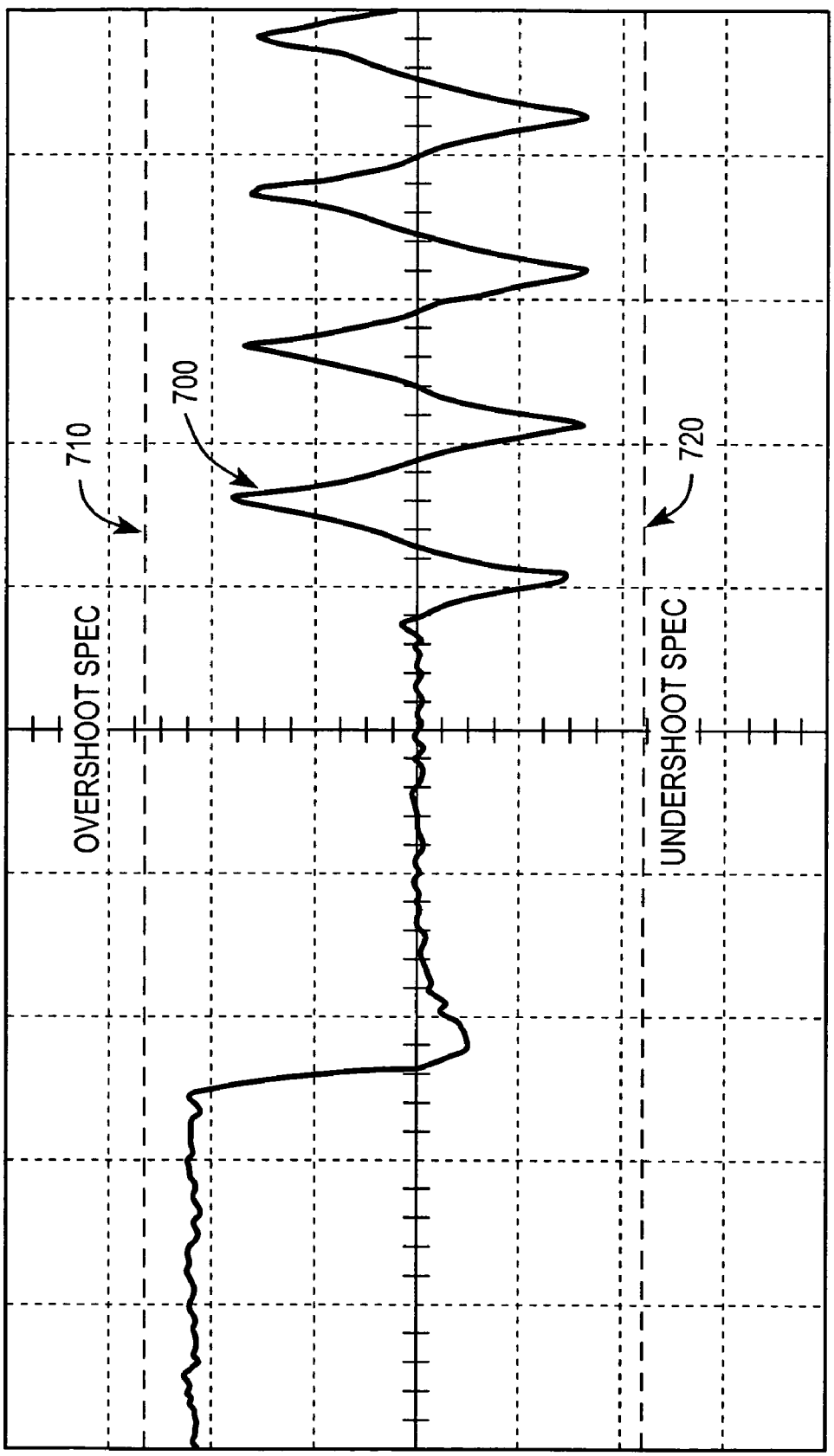
FIG. 7 shows an exemplary waveform generated by one embodiment of a spread spectrum off to spread spectrum on transition circuit.

FIG. 7 shows an exemplary waveform generated by one embodiment of a spread spectrum off to spread spectrum on transition circuit. The initial frequency of the waveform 700 is about 100 MHz and spread spectrum modulation is off. When a request for turning on spread spectrum modulation comes, the frequency goes to about 99.75 MHz and spread modulation starts after about 100 us. In the current example, spread percentage is about 0.5%, and therefore, frequency modulation range is about 99.5 MHz to 100 MHz. As a result, the center frequency is at about 99.75 MHz. Overshoot and undershoot specification limits are shown with dashed lines 710 and 720, respectively. Note that the waveform 700 lies between the dashed lines 710 and 720. That is, the frequency change of the waveform 700 does not violate the specification limits 710 and 720 in the current example.

Figure 8:
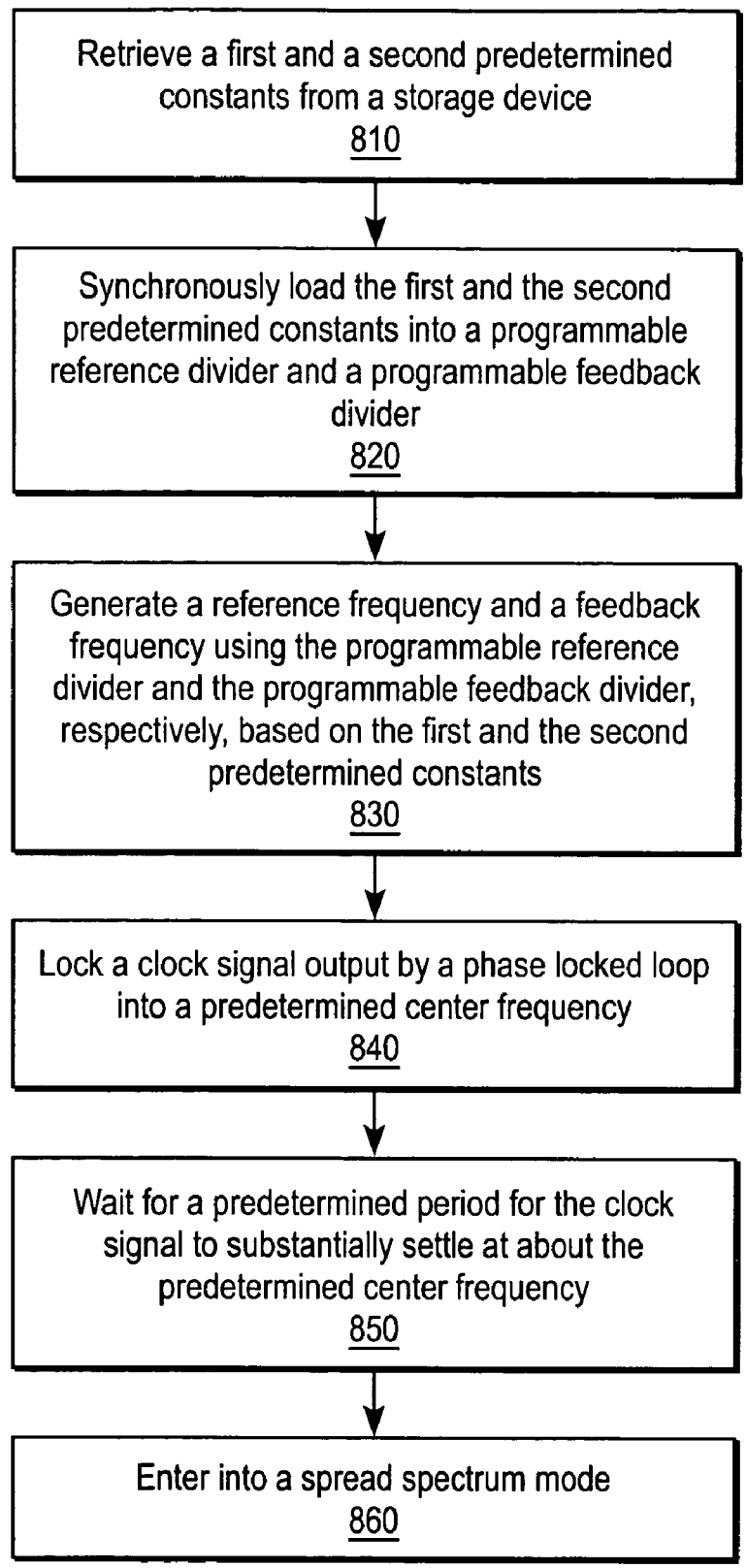
FIG. 8 shows one embodiment of a process to start spread spectrum modulation.

FIG. 8 shows one embodiment of a process to start spread spectrum modulation on a clock signal. The process is performed by processing logic that may comprise hardware (e.g., circuitry, dedicated logic, etc.), software (such as is run on a general-purpose computer system, a server, or a dedicated machine), or a combination of both.

In one embodiment, processing logic retrieves a first predetermined constant and a second predetermined constant from a storage device (processing block 810). The first and the second predetermined constants are associated with a center frequency in a spread spectrum mode. Processing logic synchronously loads the first and the second predetermined constants into a programmable reference divider and a programmable feedback divider (processing block 820). Then processing logic generates a reference frequency and a feedback frequency using the programmable reference divider and the programmable feedback divider, respectively, based on the first and the second predetermined constants (processing block 830). Processing logic further locks a clock signal output by a PLL into a predetermined center frequency (processing block 840). Processing logic then waits for a predetermined period for the clock signal to substantially settle at about the predetermined center frequency (processing block 850). After waiting for the predetermined period, processing logic enters into the spread spectrum mode to start spread spectrum modulation (processing block 860).

Figure 9:
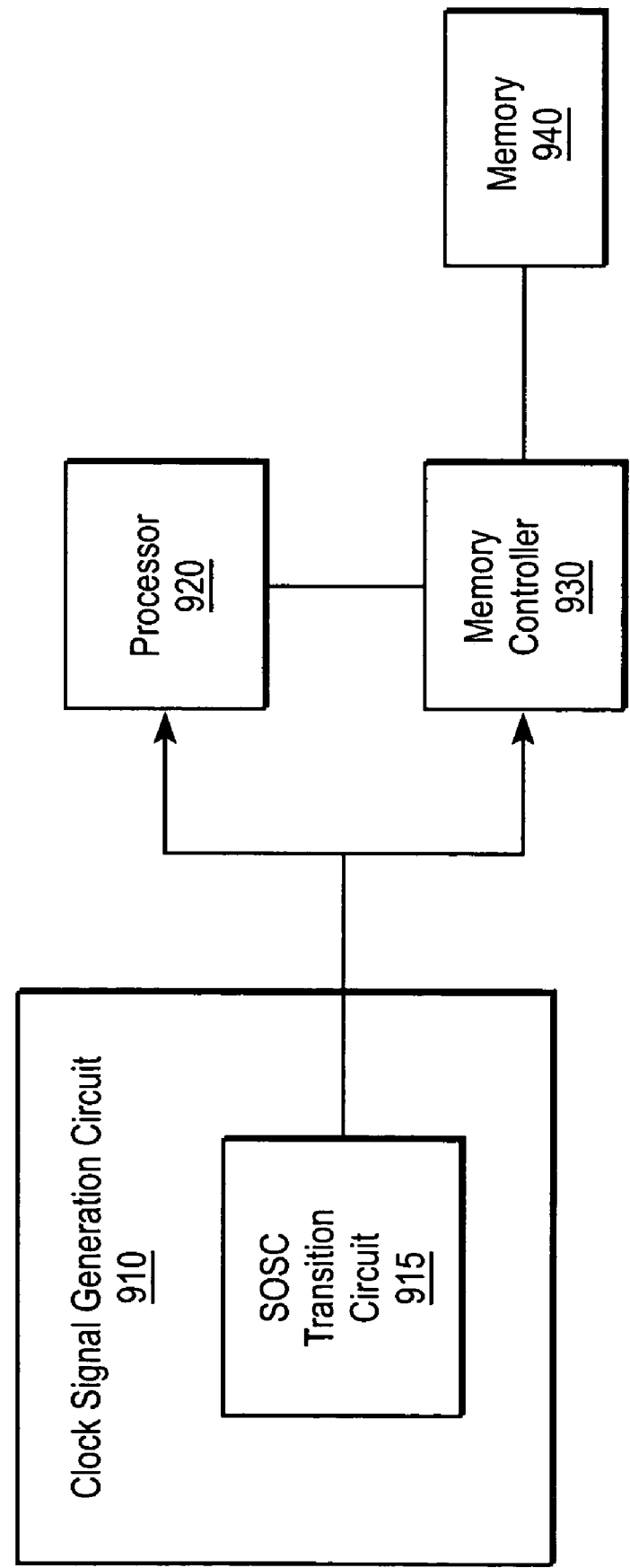
FIG. 9 shows an exemplary embodiment of a computing system usable with some embodiments of the spread spectrum off to spread spectrum on transition circuit.

FIG. 9 illustrates one embodiment of a computing system 900 usable with some embodiments of the spread spectrum off to spread spectrum on transition circuit described above. The computing system 900 includes a clock signal generation circuit 910, a processor 920, a memory controller 930, and a memory 940. The memory 940 is coupled to the processor 920 via the memory controller 930. Both the processor 920 and the memory controller 930 are coupled to the clock signal generation circuit 910 to receive a clock signal from the clock signal generation circuit 910. In other words, the processor 920 and the memory controller 930 are clocked by the output clock signal from the clock signal generation circuit 910. The memory 940 may include different types of storage devices, such as, for example, dynamic random access memory (DRAM), flash memory, EPROMs, EEPROMs, etc. Also, the memory 940 may include synchronous memory and/or asynchronous memory.

In one embodiment, the clock signal generation circuit 910 includes a spread spectrum off to spread spectrum on transition circuit 915. The spread spectrum off to spread spectrum on transition circuit 915 may includes a PLL to generate a clock signal output. The spread spectrum off to spread spectrum on transition circuit 915 may further include a control block coupled to the PLL to cause the PLL to lock the clock signal to a predetermined center frequency before entering into a spread spectrum mode. As such, overshoot and/or undershoot in the output clock signal may be reduced as explained above. Since the processor 920 and the memory controller 930 may be sensitive to frequency drifts, the performance of the processor 920 and/or the memory controller 930 at higher frequencies may be improved by reducing the overshoot and/or undershoot in the output clock signal.

Note that any or all of the components of the computing system 900 and associated hardware may be used in various embodiments of the present invention. However, it can be appreciated that other configurations of the computing system 900 may include additional or fewer components than those illustrated in FIG. 9.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. A method, comprising:
    in response to a request signal to enter a spread spectrum mode, locking a clock signal output by a phase lock loop into a predetermined center frequency, wherein the predetermined center frequency is different than a center frequency in the spread spectrum mode; and
    waiting for a predetermined period for the clock signal to substantially settle at about the predetermined center frequency before entering the spread spectrum mode.

2. The method of claim 1, further comprising:
    using a counter to time the predetermined period.

3. The method of claim 1, further comprising:
    synchronously loading a first and a second predetermined constants associated with the predetermined center frequency into a programmable reference divider and a programmable feedback divider, respectively.

4. The method of claim 3, further comprising:
    generating a reference frequency and a feedback frequency using the programmable reference divider and the programmable feedback divider, respectively, based on the first and the second predetermined constants, respectively.

5. The method of claim 3, further comprising:
    retrieving the first and the second predetermined constants from a read-only memory (ROM).

6. The method of claim 3, further comprising:
    deriving at least one of the first and the second predetermined constants from a reference value associated with spread spectrum modulation being turned off.

7. The method of claim 1, further comprising:
    clocking a processor coupled to the phase lock loop using the clock signal.

8. An apparatus, comprising:
    a phase lock loop operable to output a clock signal in a spread spectrum mode or a non-spread spectrum mode; and
    a control block coupled to the phase lock loop to cause the phase lock loop to lock the clock signal to a predetermined center frequency before transitioning from the non-spread spectrum mode into the spread spectrum mode, wherein the predetermined center frequency is different than a center frequency in the spread spectrum mode.

9. The apparatus of claim 8, wherein the control block comprises a counter to start counting in response to a request signal to start spread spectrum modulation.

10. The apparatus of claim 8, further comprising:
    a programmable reference divider coupled between the phase lock loop and the control block; and
    a programmable feedback divider coupled between the phase lock loop and the control block.

11. The apparatus of claim 10, wherein the control block comprises:
    a switch coupled to the programmable feedback divider to cause a second predetermined constant to be loaded synchronously with a first predetermined constant into the programmable feedback divider and the programmable reference divider, respectively.

12. The apparatus of claim 11, further comprising:
    a first register coupled to the programmable reference divider to hold the first predetermined constant; and
    a second register coupled to the programmable feedback divider to hold the second predetermined constant.

13. The apparatus of claim 12, further comprising:
    a first signal selecting circuit coupled between the control block and the programmable reference divider; and
    a second signal selecting circuit coupled between the control block and the programmable feedback divider.

14. The apparatus of claim 13, wherein the second signal selecting circuit comprises a multiplexer.

15. The apparatus of claim 13, wherein the first signal selecting circuit comprises:
    an exclusive or (XOR) gate; and
    an inverter.

16. The apparatus of claim 8, further comprising:
    a processor coupled to the phase lock loop, wherein the processor is clocked by the clock signal output by the phase lock loop.

17. The apparatus of claim 16, further comprising:
    a memory device coupled to the processor and the phase lock loop, wherein the processor is operable to access data stored in the memory device.

18. An apparatus, comprising:
    means for generating a clock signal; and
    means for reducing at least one of overshoot and undershoot of an output frequency of the clock signal, wherein the means for reducing at least one of overshoot and undershoot of the output frequency of the clock signal comprises:
    means for locking the output frequency of the clock signal to a predetermined center frequency prior to starting a spread spectrum mode wherein the predetermined center frequency is different from a center frequency in spread spectrum.

19. The apparatus of claim 18, wherein the means for reducing at least one of overshoot and undershoot of the output frequency of the clock signal further comprises:
    means for waiting for a predetermined period for the predetermined center frequency to substantially settle at about a predetermined value.

* * * * *